US010919082B2

(12) United States Patent
Shah et al.

(10) Patent No.: US 10,919,082 B2
(45) Date of Patent: *Feb. 16, 2021

(54) CAST COMPONENTS AND MANUFACTURE AND USE METHODS

(71) Applicant: Raytheon Technologies Corporation, Farmington, CT (US)

(72) Inventors: Dilip M. Shah, Glastonbury, CT (US); Alan D. Cetel, West Hartford, CT (US); John J. Marcin, Jr., Marlborough, CT (US); Steven J. Bullied, Pomfret Center, CT (US); Carl R. Verner, Windsor, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 71 days.

This patent is subject to a terminal disclaimer.

(21) Appl. No.: 16/245,787

(22) Filed: Jan. 11, 2019

(65) Prior Publication Data

US 2019/0143392 A1 May 16, 2019

Related U.S. Application Data

(62) Division of application No. 14/748,688, filed on Jun. 24, 2015, now Pat. No. 10,315,241.

(60) Provisional application No. 62/019,681, filed on Jul. 1, 2014.

(51) Int. Cl.
| | |
|---|---|
| *B21D 51/02* | (2006.01) |
| *C30B 11/00* | (2006.01) |
| *C30B 29/52* | (2006.01) |
| *B22D 21/00* | (2006.01) |
| *B23K 28/00* | (2006.01) |
| *B23P 15/02* | (2006.01) |

(52) U.S. Cl.
CPC ............. *B21D 51/02* (2013.01); *B22D 21/00* (2013.01); *B23K 28/00* (2013.01); *C30B 11/002* (2013.01); *C30B 29/52* (2013.01); *B23P 15/02* (2013.01); *Y10T 29/49989* (2015.01)

(58) Field of Classification Search
CPC ........ B21D 51/02; B23K 28/00; B22D 21/00; B23P 15/02; C30B 29/52; C30B 11/002
See application file for complete search history.

(56) References Cited

U.S. PATENT DOCUMENTS

| | | | |
|---|---|---|---|
| 3,494,709 | A | 2/1970 | Piearcey |
| 4,548,255 | A | 10/1985 | Reiner et al. |
| 5,097,586 | A | 3/1992 | Sawyer |
| 5,176,864 | A | 1/1993 | Bates et al. |
| 6,969,240 | B2 | 11/2005 | Strangman |

(Continued)

FOREIGN PATENT DOCUMENTS

| | | |
|---|---|---|
| EP | 2133756 A2 | 12/2009 |
| GB | 1207452 A | 10/1970 |
| WO | 2005/045532 A2 | 5/2005 |

OTHER PUBLICATIONS

European Search Report for EP Patent Application No. 15174119.6, dated Oct. 23, 2015.

(Continued)

*Primary Examiner* — Ryan J. Walters
(74) *Attorney, Agent, or Firm* — Bachman & LaPointe, P.C.

(57) ABSTRACT

A method comprises: providing a spiral metallic workpiece having a cast structure associated with such spiral; and at least partially flattening the workpiece.

13 Claims, 10 Drawing Sheets

(56) References Cited

U.S. PATENT DOCUMENTS 7,686,065 B2 3/2010 Luczak
2009/0303842 A1 12/2009 Gritti et al.

OTHER PUBLICATIONS

Metalworking Products, Jan. 1, 2006, pp. A6, A80-A86, & B2-B13, Sandvik Coromant US, Fair Lawn, NJ.
European Search Report for EP Patent Application No. 15174119.6, dated Apr. 5, 2018.
US Office Action dated Feb. 6, 2018 for U.S. Appl. No. 14/748,688.
Extended European Search Report dated Feb. 28, 2019 for European Patent Application No. 19153321.5.

US 10,919,082 B2

CAST COMPONENTS AND MANUFACTURE AND USE METHODS

CROSS-REFERENCE TO RELATED APPLICATIONS

This is a divisional application of U.S. patent application Ser. No. 14/748,688, filed Jun. 24, 2015 and entitled "Cast Components and Manufacture and Use Methods", which claims benefit of U.S. Patent Application No. 62/019,681, filed Jul. 1, 2014, and entitled "Cast Components and Manufacture and Use Methods", the disclosures of which are incorporated by reference herein in their entireties as if set forth at length.

BACKGROUND

The disclosure relates to casting of single-crystal components. More particularly, the disclosure relates to manufacture of single crystal plates.

There is no simple way to make large sheets of nickel base superalloy single crystal other than by directional solidification of an investment cast mold. This is limited by furnace size and both in terms of diameter of the furnace and height to which the mold can be withdrawn. With the application of single crystal technology to manufacture of industrial gas turbine blades the required furnace size has expanded and currently it may be approaching several feet in diameter and height of withdrawal. But use of this process may require much higher investment, including liquid metal cooling, or otherwise may face the technical challenge of maintaining the thermal gradient as the bottom chill plate is withdrawn beyond a certain height.

SUMMARY

One aspect of the disclosure involves a method comprising: providing a spiral metallic workpiece having a cast structure associated with such spiral; and at least partially flattening the workpiece.

A further embodiment of any of the foregoing embodiments may additionally and/or alternatively include the providing comprising making a spiral cut in the metallic workpiece.

A further embodiment of any of the foregoing embodiments may additionally and/or alternatively include the providing comprising providing an as-cast spiral gap in the metallic workpiece.

A further embodiment of any of the foregoing embodiments may additionally and/or alternatively include the metallic workpiece having a single crystal (SX) structure.

A further embodiment of any of the foregoing embodiments may additionally and/or alternatively include the metallic workpiece having modified a single crystal (SX) structure characterized by a progressively circumferentially varying crystallographic orientation.

A further embodiment of any of the foregoing embodiments may additionally and/or alternatively include the spiral being about an axis within 5° of a <001> or <111> direction of the workpiece.

A further embodiment of any of the foregoing embodiments may additionally and/or alternatively include the metallic workpiece being a right circular cylinder.

A further embodiment of any of the foregoing embodiments may additionally and/or alternatively include the metallic workpiece being a hollow right circular cylinder.

A further embodiment of any of the foregoing embodiments may additionally and/or alternatively include the workpiece being a nickel-based superalloy.

A further embodiment of any of the foregoing embodiments may additionally and/or alternatively include securing ends of the workpiece to each other or to ends of other similar workpieces so as to form a full hoop.

A further embodiment of any of the foregoing embodiments may additionally and/or alternatively include the securing comprising welding.

A further embodiment of any of the foregoing embodiments may additionally and/or alternatively include casting a precursor of the workpiece. The casting may comprise withdrawing the precursor in a direction within 1° of parallel to an axis of the spiral.

A further embodiment of any of the foregoing embodiments may additionally and/or alternatively include forming a mold by shelling a spiral core.

A further embodiment of any of the foregoing embodiments may additionally and/or alternatively include forming the spiral core by bending a refractory metal sheet and ceramic coating the sheet.

A further embodiment of any of the foregoing embodiments may additionally and/or alternatively include forming the spiral core by rolling into a spiral a sandwich of a cloth sheet and wax.

A further embodiment of any of the foregoing embodiments may additionally and/or alternatively include an article made by the process.

The details of one or more embodiments are set forth in the accompanying drawings and the description below. Other features, objects, and advantages will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
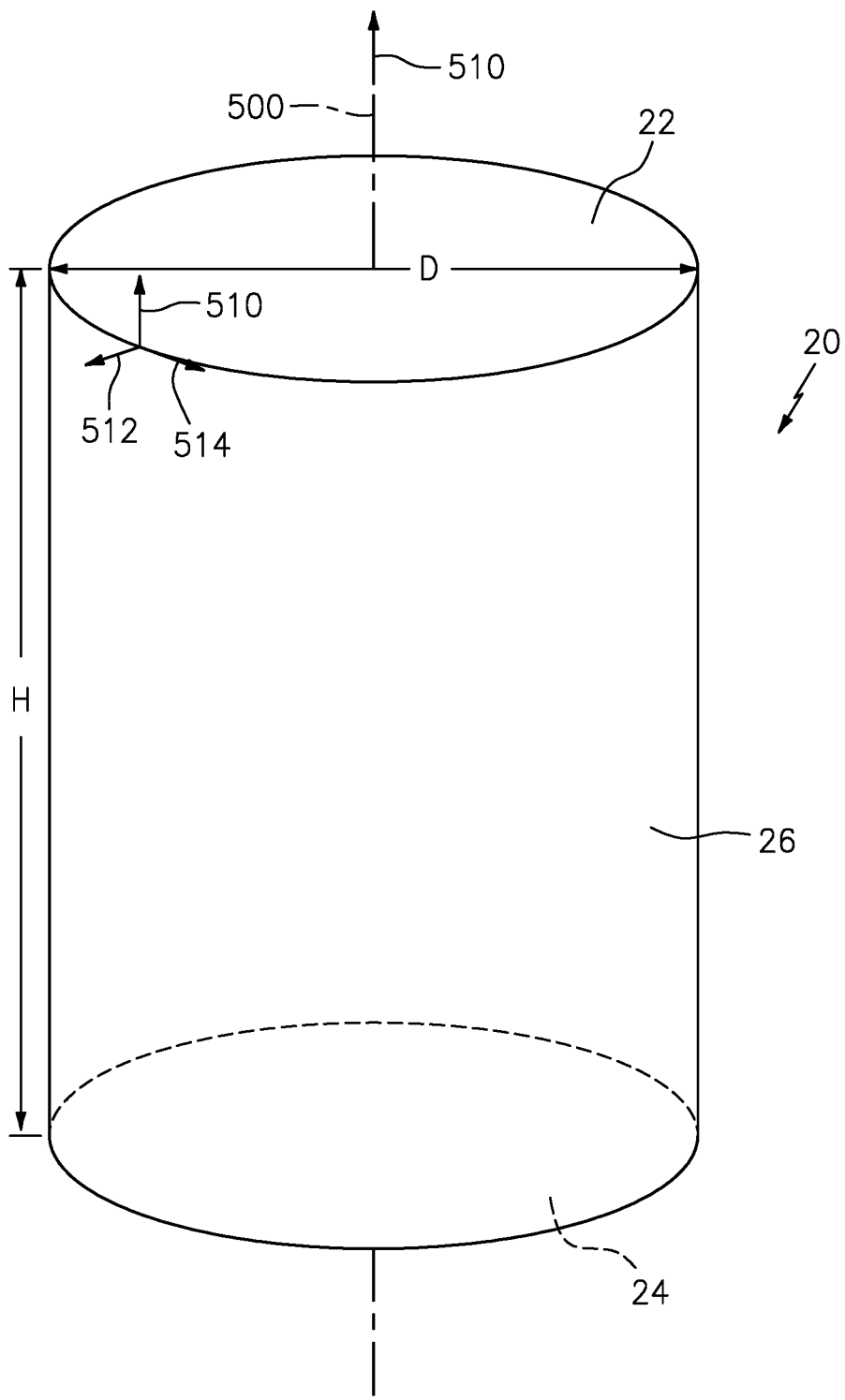
FIG. 1 is a view of a cast single-crystal cylinder.

FIG. 1 shows a single crystal (SX) workpiece 20. The exemplary workpiece is a right circular cylinder having a first end 22, a second end 24, and a lateral surface 26 joining the first end and second end. The workpiece has a central longitudinal axis 500. The cylinder has a diameter D and a height H.

In an exemplary process, a spiral cut 28 (FIG. 2) is made in the workpiece. As is discussed below, the resulting spiral structure is later at least partially flattened for further use.

The exemplary cut extends through an outer region 52 of the workpiece from a first end 30 at the surface 26 (at outer radius $R_O$ which is half of D) to a second end 32 in the interior of the workpiece. In this example, the cut ends shy of an inboard/interior portion 50 of the cylinder having a radius $R_I$. This may result from several factors, such as difficulty of cutting and limiting the amount of flattening the piece must subsequently undergo.

The spiral is about one or more axes parallel to the axis 500. It may be about the axis 500 or may shift to provide desired thickness profile. The cut may be made by electric discharge machining using a thin wire. Typically such a wire of exemplary thickness of 0.015 inch (0.4 mm) is continuously spooled through the cut in a conducting oil or water bath and either the workpiece or the wire harness may be programmed move relative to each other to achieve the desired cut.

Figure 2:
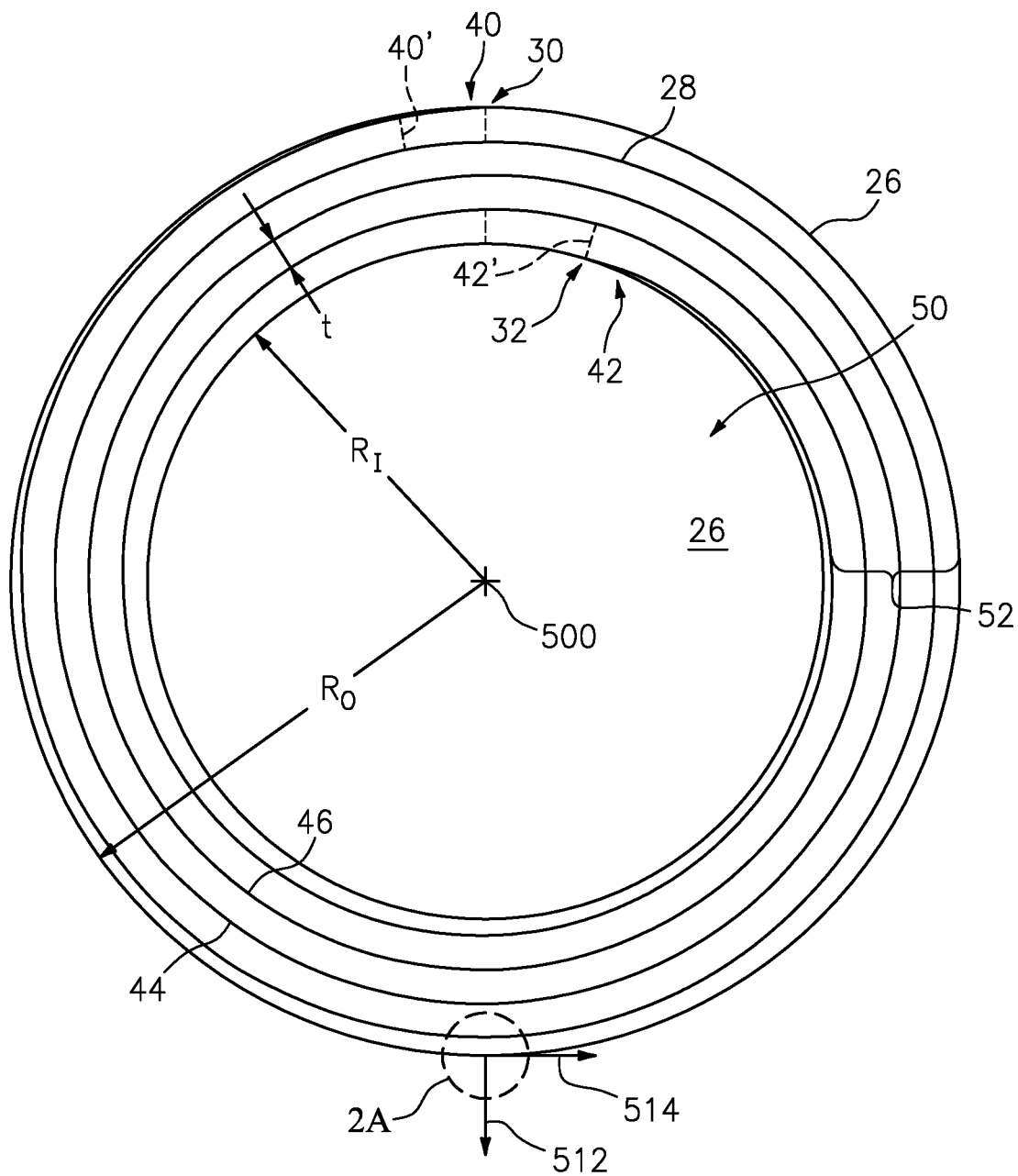
FIG. 2 is an end view of the cylinder after spiral cutting.

In the FIG. 2 example, the cylinder may be held between two chucks (not shown) at central portions of the respective ends 22 and 24. After the initial set up with the wire touching the outer surface of the cylinder, the relative motion may be programmed by the following equations, defining X and Y, to generate a spiral cut.

$$X=[(D/2)-((t+w)\theta/360)] \cos \theta;$$

$$Y=[(D/2)-((t+w)\theta/360)] \sin \theta$$

In these equations, D is outer diameter of the cylinder, t is the thickness of the sheet desired, and w is the width of the wire. $\Theta$ is angle which will continually increase from 0 to multiples of 360 depending on how deep one wants to practically cut. If desired, in the final round of spiral cut the thickness t may be set to 0 for the spiral cut to end on the previous cut surface separating the spiral from the inner cylinder. For example, this may be done to leave the radius $R_I$ in FIG. 2.

Figure 2A:
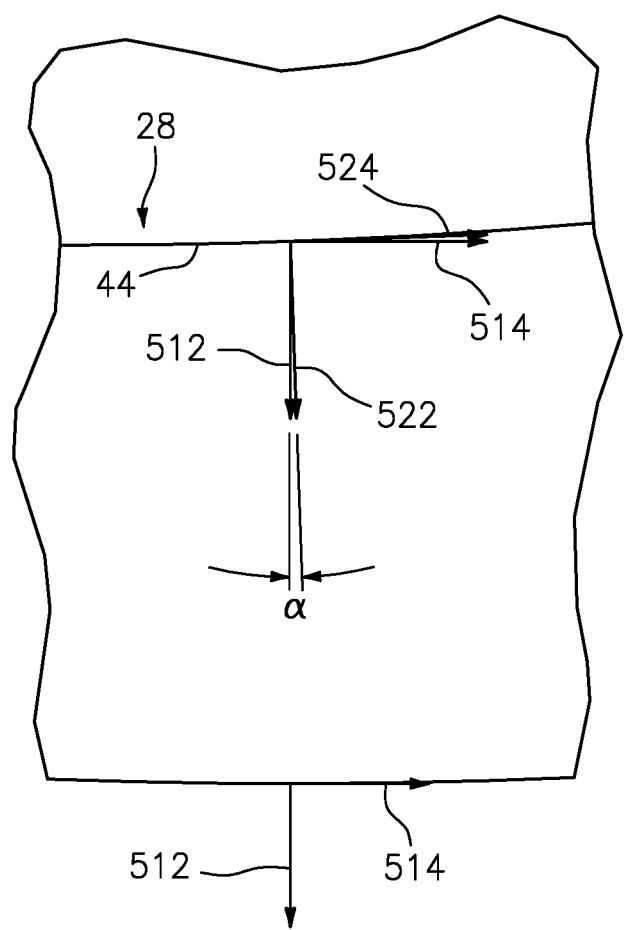
FIG. 2A is an enlarged view of a portion of the cylinder end of FIG. 2.

The cut leaves the workpiece as a spiral form (FIG. 2) extending from a first end 40 to a second end 42 and having a first face 44 and a second face 46. An exemplary spiral represents an at least 90° slice, more narrowly, at least 180° or at least 360° or at least 720°. FIG. 2A shows a radial direction 512 of the cylinder and a circumferential or tangential direction 514. It also shows an outward normal direction 522 from the cut and a direction 524 tangential to the cut. These are offset from directions 512 and 514, respectively by a spiral angle $\alpha$. Exemplary $\alpha$ is very low (e.g., 2°, more broadly up to 10° or 1.0-4.0°).

Figure 3:
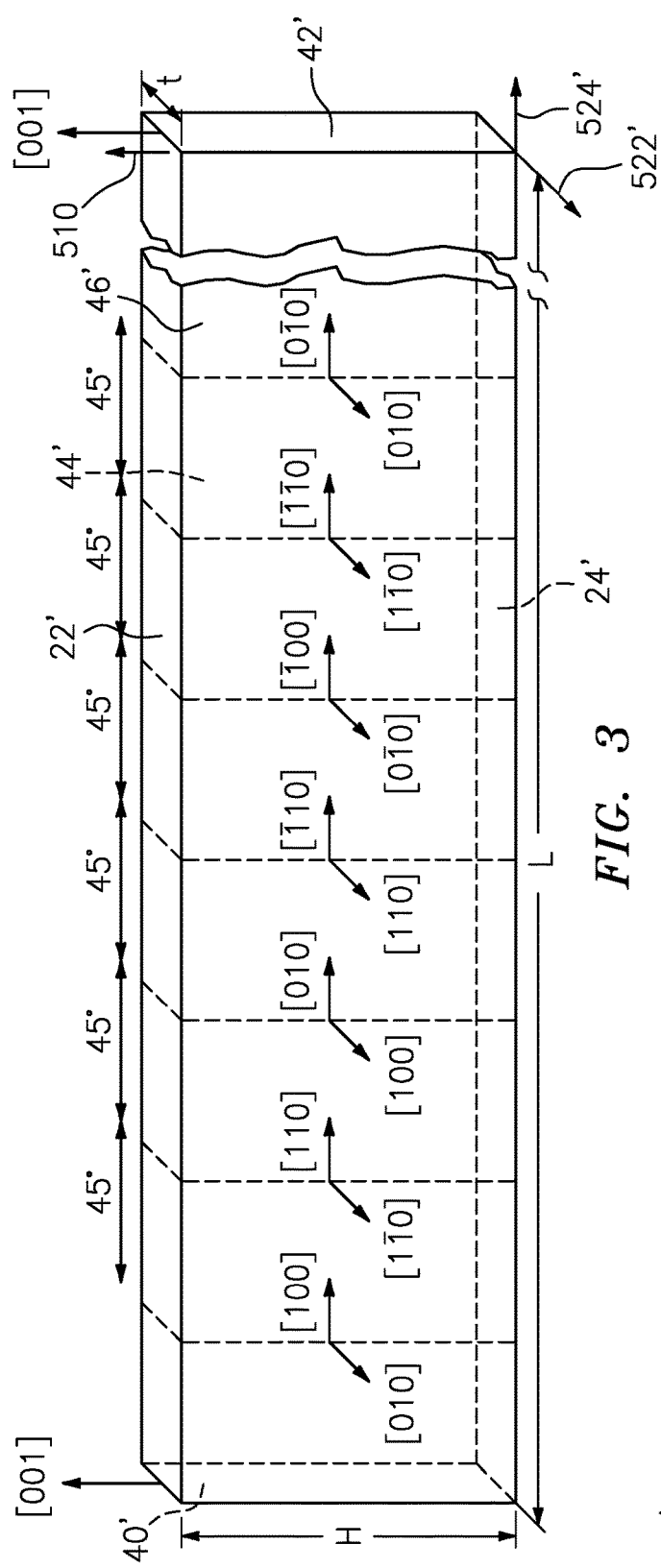
FIG. 3 is a view of a plate formed by flattening and machining the spiral cut cylinder.

The spiral form may be at least partially flattened. An exemplary flattening process involves unrolling. To facilitate the process, the nickel-based superalloys may be solution heat treated and slow cooled or over-aged to coarsen the precipitates. This heat treatment may be carried out for the single crystal ingot before or after the spiral cutting. FIG. 3 shows a fully flattened spiral with the surfaces 44 and 46 having become faces 44', 46' of a plate (or sheet). The plate has a thickness t between the faces. Exemplary t is up to 10 mm, more particularly 1-3 mm.

A height H (or a sheet width) between edge surfaces 22' and 24' (formed by the former surfaces 22 and 24, respectively) remains H assuming no further machining is performed on such faces. The plate has a length L between ends 40' and 42'. These ends may be formed by removing (e.g., cutting) material off the ends 40 and 42 so as to true-up the ends and provide a remainder portion of the sheet having uniform thickness requirement. The direction 522 has become a surface normal 522' of the faces and the direction 524 has become a lengthwise direction.

The plate has crystal structure wherein the crystallographic direction in which the single crystal cylinder was grown remains parallel to the heightwise/axial direction 500. FIG. 1 shows one of the two opposite axial directions 510, a radial direction 512, and a tangential direction 514. At any given location in the cylinder, the crystalline axis aligned with the direction 510 will remain constant. However, the crystalline geometry and properties in the radial and circumferential directions will vary with circumferential location. When the spiral is unwrapped, the crystallographic directions transverse to 510 is going to modulate along the length corresponding to the symmetry of the crystal. With the small angle $\alpha$, the crystallographic direction associated with the directions 522 and 524 (and thus 522' and 524') will be essentially the same as those associated with 512 and 514, respectively.

A first example is a single crystal cylinder with a <100> axial orientation and four-fold symmetry. The secondary direction <100> will have a given orientation relative to the surface at 90° intervals about the cylinder circumference. When the spiral is unwrapped, such secondary orientation relative to faces 44', 46' will occur at lengthwise intervals corresponding to those 90° intervals (see FIG. 3, e.g., the [010] and [100] are crystallographically identical <001> directions). The lengthwise spacing will progressively decrease as one progresses from the outboard end of the cut to the inboard end of the cut.

Figure 5:
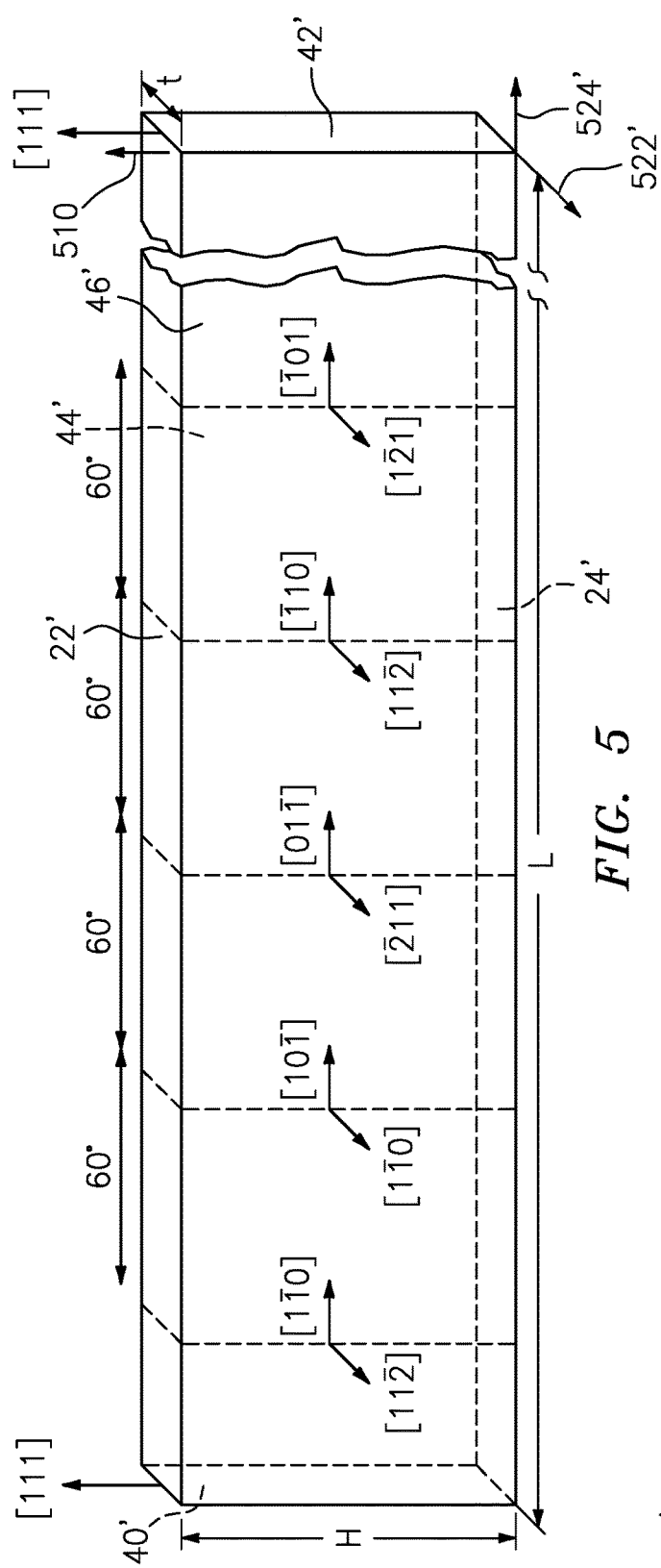
FIG. 5 is a view of a plate formed by flattening and machining a spiral cut cylinder with differing crystallographic orientation relative to FIG. 3.

A second example is a single crystal cylinder with a <111> axial orientation and three fold symmetry. In such example, the <110> direction will repeat itself every 120° about the cylinder (see FIG. 5, e.g. the [11$\bar{2}$] and [$\bar{2}$11] are equivalent <112> directions). Such the greater pattern will occur at progressively decreasing length intervals corresponding to every 360°.

Figure 4:
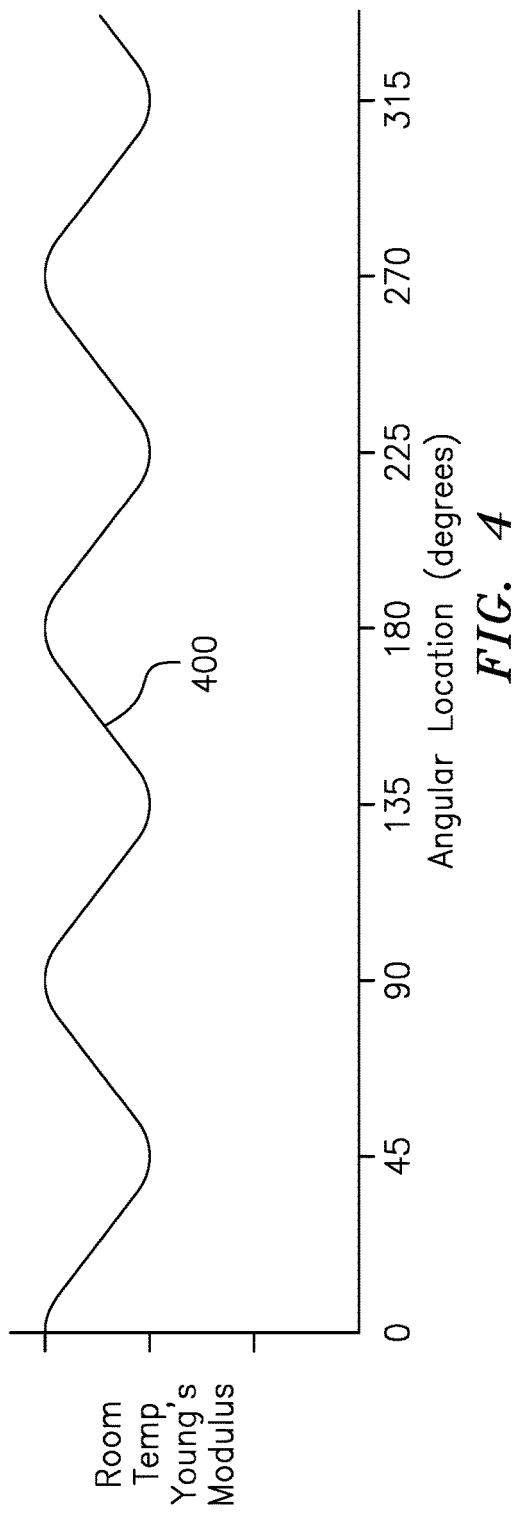
FIG. 4 is a plot of Young's modulus vs. original circumferential position for the plate of FIG. 3.
Figure 6:
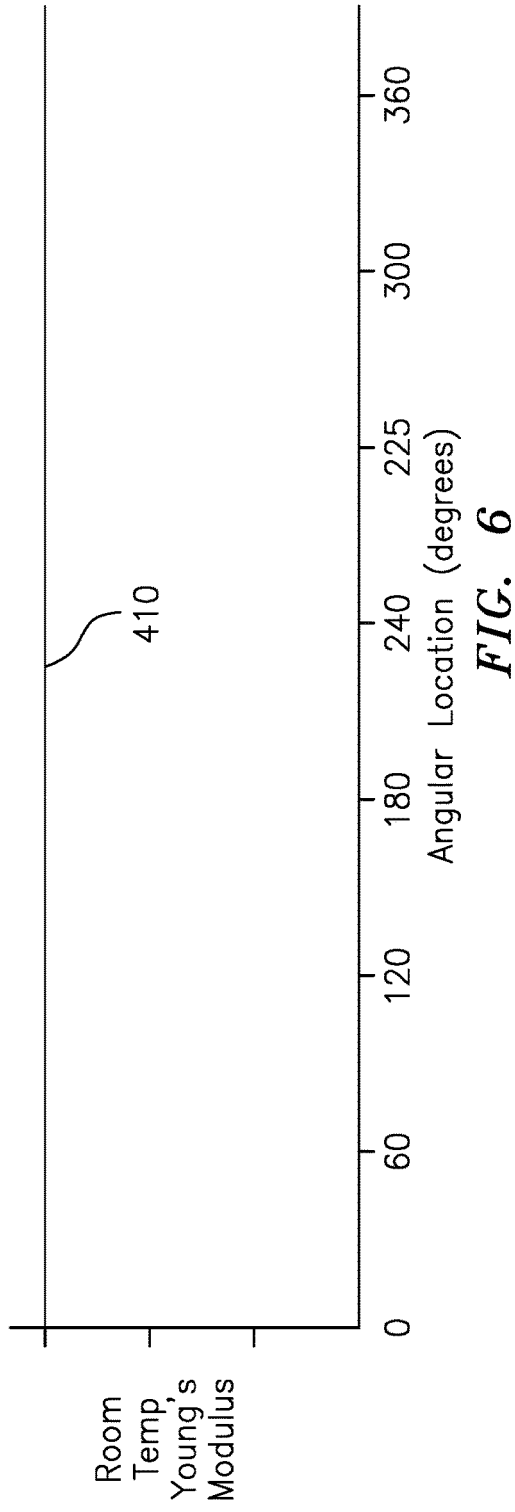
FIG. 6 is a plot of Young's modulus vs. original circumferential position for the plate of FIG. 5.

For structural applications, variation in Young's modulus is more relevant than the modulation of crystallographic direction along the length. For a sheet machined out of cylinder with a <100> axial orientation there will be substantial Young's modulus variation (peak values 50% greater than trough values in plot 400 of FIG. 4). However, no variation occurs for a cylinder with <111> axial orientation (plot 410 in FIG. 6).

It is important to note, though that the lack of variation in the latter case is only in Young's modulus. Complete elastic behavior is dependent on variation in Poisson's ratio as well as shear modulus associated with a pair of crystallographic direction, which is much more complex. If, however a full 3 dimensional consideration is applied, the single crystal veneer will behave anisotropically. Criticality of this variation is dependent on design and end application.

It is known that with variation in crystallographic directions, the plastic behavior such as tensile and creep strength will vary in addition to any variation in elastic behavior). Such properties may also enter into design consideration.

Figure 7:
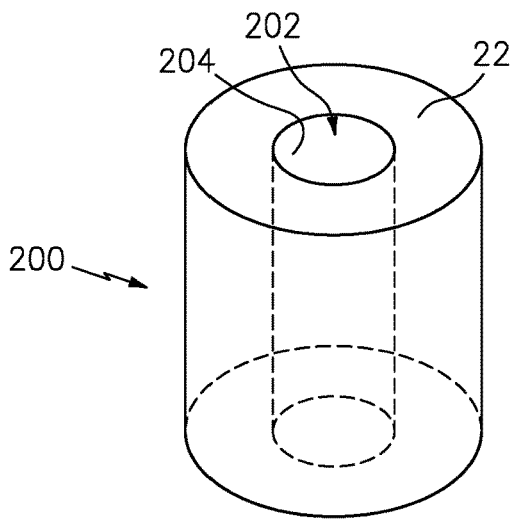
FIG. 7 is a view of a cast hollow cylinder.
Figure 8:
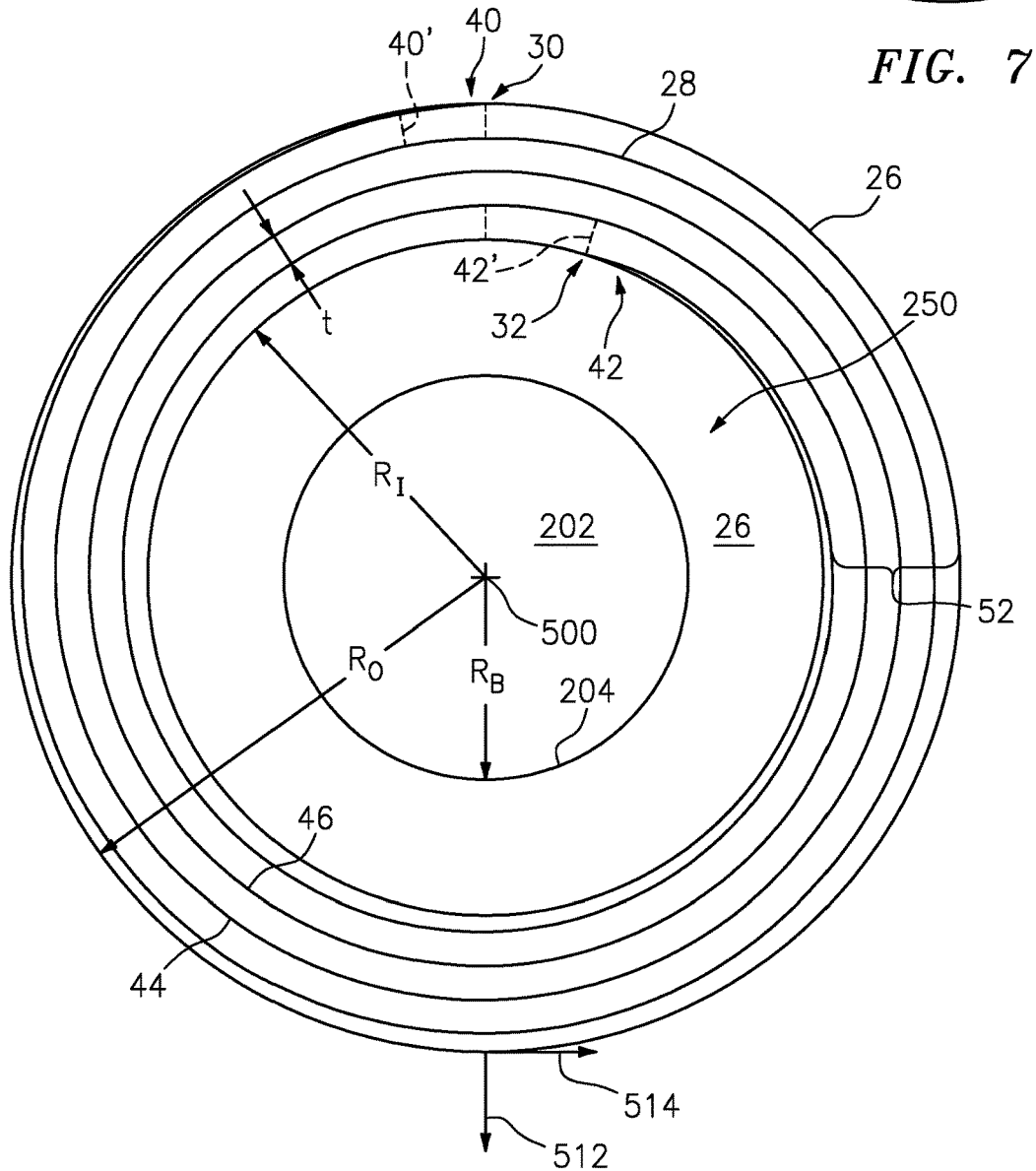
FIG. 8 is an end view of the cylinder of FIG. 7 after spiral cutting.

If the modulation of Young's modulus is not acceptable then an alternative cylinder may be used which has essentially no circumferential variation in crystalline orientation. For example, a hollow cylinder 200 (FIG. 7) may be used. The cylinder has a central passageway/bore 202 defined by an inner diameter (ID) surface 204 at a radius $R_B$ (FIG. 8).

The term "bore" is used, even though it may be an as-cast feature rather than one formed by boring a hole where none had existed. In cutting, the cylinder may be held from inside the bore and/or from portions of the cylinder ends between $R_B$ and $R_I$.

Cylinder 200 may be cast via one of several techniques. A first technique comprises using a circumferential array of seeds at a base of a cylindrical (e.g., annular) mold cavity. The seeds are oriented with the same crystallographic direction aligned with the axial direction 500 of the cylinder. The absolute orientation of the other crystallographic directions may progressively change so that every seed has the same crystallographic orientation relative to the adjacent part of the cavity. The cast cylinder 200 will mirror this distribution of crystallographic orientation. For example, if there are 36 seeds there will be grain boundaries where regions associated with adjacent seeds meet. A theoretical 10° jump in crystalline orientation will occur at these boundaries. When a spiral cut from that cylinder is unwrapped, lengthwise physical properties will be relatively close to uniform because such 10° jump is associated with a relatively small variation in physical properties.

Figure 9:
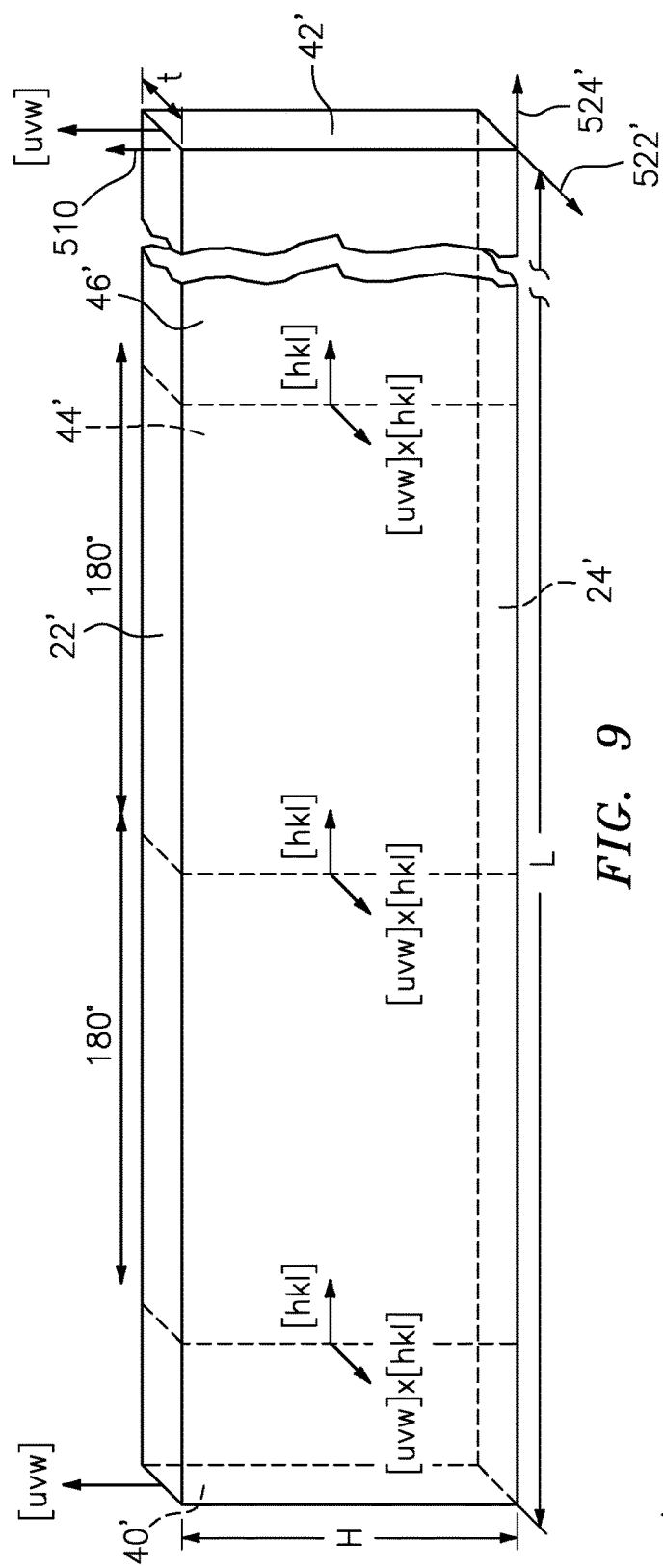
FIG. 9 is a view of a plate formed by flattening and machining the FIG. 8 spiral cut cylinder.
Figure 10:
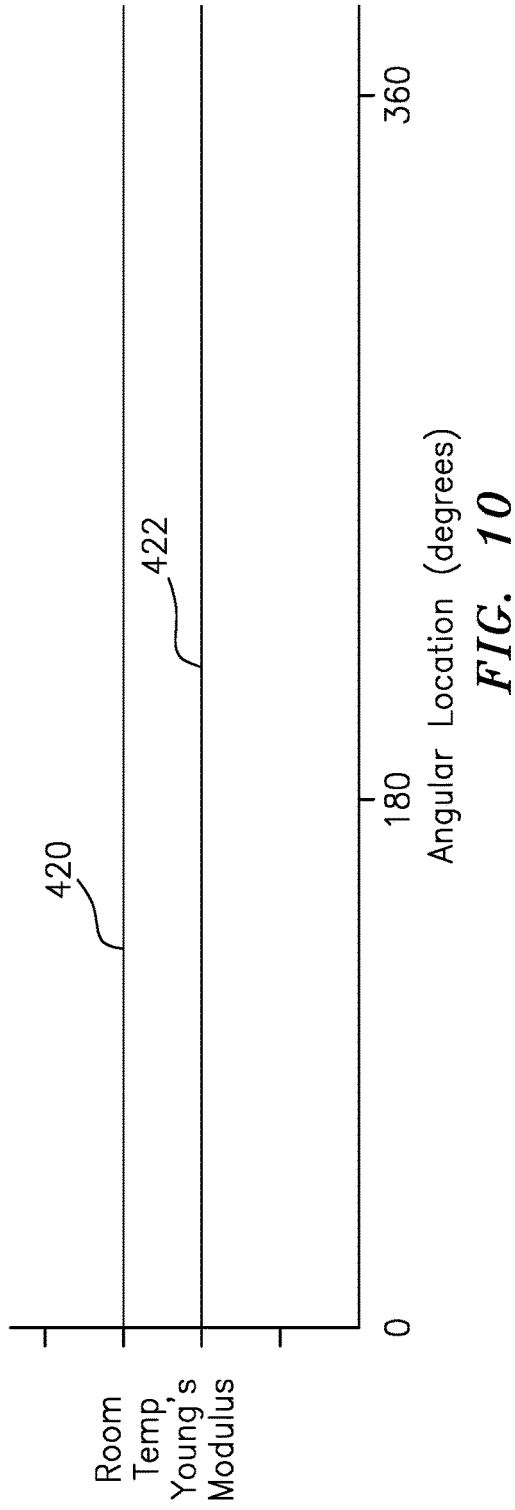
FIG. 10 is a plot of Young's modulus vs. original circumferential position for the plate of FIG. 9.

In a second technique, the cylinder 200 may be cast using one or more arcuate seeds. U.S. Patent Application No. 62/009,037, filed Jun. 6, 2014, and entitled "Arcuate Directionally Solidified Components and Manufacture Methods", the disclosure of which is incorporated by reference herein in its entirety as if set forth at length, discloses bending a single-crystal seed into an arcuate form. Such a seed bent a full 360° can be used to cast a cylinder 200 where crystalline properties relative to the outer diameter surface are essentially constant along the circumference and thus along the length of the resulting sheet or plate (FIG. 9). FIG. 9 generically shows the axial cryatalline direction as [uvw] and the lenghtwise as [hkl]. The third direction is the cross-product [uvw]×[hkl]. Exemplary [uvw], [hkl], [cross-product] combinations are: [100], [010], [00$\bar{1}$]; [111], [$\bar{1}$10], [11$\bar{2}$]; and [011], [100], [01$\bar{1}$]. Relative elastic properties depend on seed orientation. FIG. 10 shows a high modulus 420 associated with a [111] axial direction and a lower modulus 422 associated with a [100] or [011] axial direction. A plurality of bent seeds of lesser arc length may be combined to form the equivalent of a single full annulus seed.

The result of such processes is to produce a sheet that approximates a single crystal metal sheet. It may thus be desirable that the final product does not recrystallize during the straightening out and subsequent rolling process (if any). Rolling may be desirable to even out the thickness, reduce the thickness, or impart some cold work to the as cast piece, depending on the end application. Control of the amount of deformation and temperature at which this is carried out may be performed to avoid recrystallization. This may be verified by macroetching (e.g., in an initial process set up) and then subsequently by critical process control (e.g., selection of heat treatment parameters, cutting parameters, and the like). Depending on the nickel base alloy composition and especially the presence of minor elements carbon, boron, zirconium and hafnium, grain defects with misorientation up to 6° or 12° may be acceptable. In some situations, tighter tolerance may be required in critical areas, while such defects may be allowed in no-critical areas.

Such a technique can be used for coarse grained equiaxed castings and for directionally solidified columnar grain castings. Currently large sheet metal pieces of nickel base alloys with high volume fraction of gamma prime precipitates and coarse grain or columnar grains are not produced. While sheet metals with such structures are less attractive compared to single crystal sheet metal; nonetheless they may be more cost effective options for certain applications.

The plate or thin foil procured this way may be used in many applications which are currently typically manufactured from sheet metal. This may include exhaust liners, rim seals, W-seals, and honeycombs made with brazed thin sheets (both the cells and face sheets, if any). For example, existing honeycomb may be made of oxide dispersion strengthened (ODS) iron and nickel base alloys, 1. Easy formability requires these prior art components to be typically fine grained solid solution hardened alloys with very low volume fraction (<40%) of the strengthening γ' intermetallic phase based on $Ni_3Al$. Even though increasing volume fraction of this phase to higher volume fraction (e.g., >60%) is advantageous for enhancing temperature capability and oxidation resistance, it generally makes the alloy less amenable to sheet metal forming. In some applications, ODS iron and nickel base alloys prepared by mechanical alloying are also used, and in other application niobium based solid solution alloys are also used. Replacing these special alloys with single crystal sheets, could prove economically more advantageous, without any loss of temperature performance. Additionally, enabling the availability of single crystal sheets is likely to expand the design options and allow designers to create new components, or allow existing components to be manufactured by different methods. For example one proposed manufacture technique for a blade was bonding two cast halves to create complex cooling passages. With availability of large single crystal metal sheets/plates, identical shapes of sheet metal can be stamped out and bent and bonded to create hollow airfoils.

Even where cast single crystal are currently used, such as combustor panels, this approach may prove more economical. In some such possible embodiments, the plate may be re-bent or the flattening may be only partial. This can allow the workpiece to assume arcuate form. Segments of such material may have mounting lugs or other features secured (e.g., welded) such as to one or both of the faces.

These direct casting of spiral techniques may involve withdrawal direction within a tight tolerance (e.g. within 1° (1° or less) or 5° of the spiral axis (axes) to yield the desired crystalline direction within 10°, 6°, or 5° of the spiral axis (axes) or withdrawal direction.

The partial rebending or less-then-complete unrolling may allow the ends 40' and 42' to be secured to each other to create a tubular structure. For example, a tubular lining for engine cases may be made to enhance temperature capability.

Figure 11:
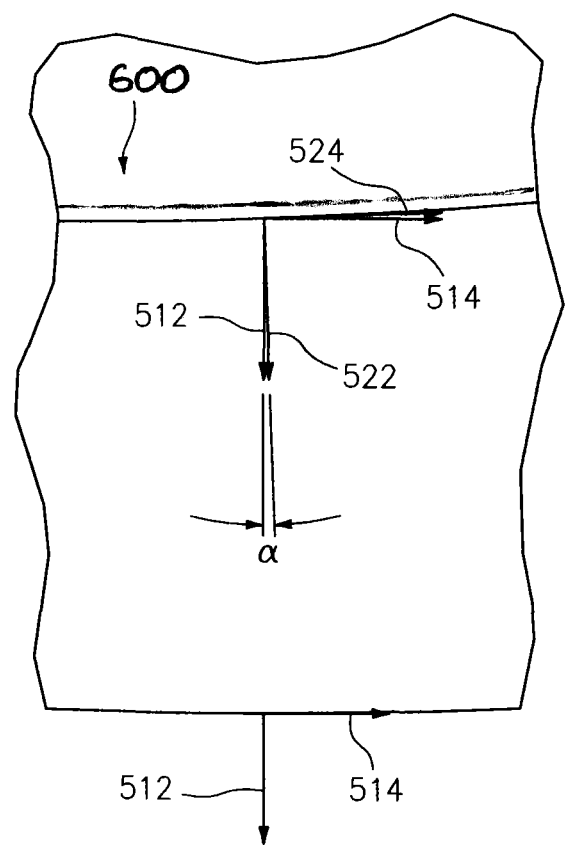
FIG. 11 is a partial end view of alloy cast around a spiral refractory metal core.

While cutting (e.g., wire EDM) of a cast ingot remains a more desirable process, from the point of view of dimensional control, other alternative approaches are also possible. One potential approach is to cast the single crystal cylinder using spiral refractory metal core 600 (FIG. 11) to form a gap similar to the aforementioned cut. Such cores may be made out of refractory metal (e.g., molybdenum) sheets bent into a spiral and ceramic coated (e.g., alumina) to inhibit liquid nickel alloys from reacting with molybdenum. Such cores may be stiffened by techniques such as: by holding them in top and bottom ceramic plates appropriately machined with spiral grooves; or by ceramic or coated molybdenum spacers at the top and the bottom. FIG. 11 shows metal 602 cast over the core.

Figure 12:
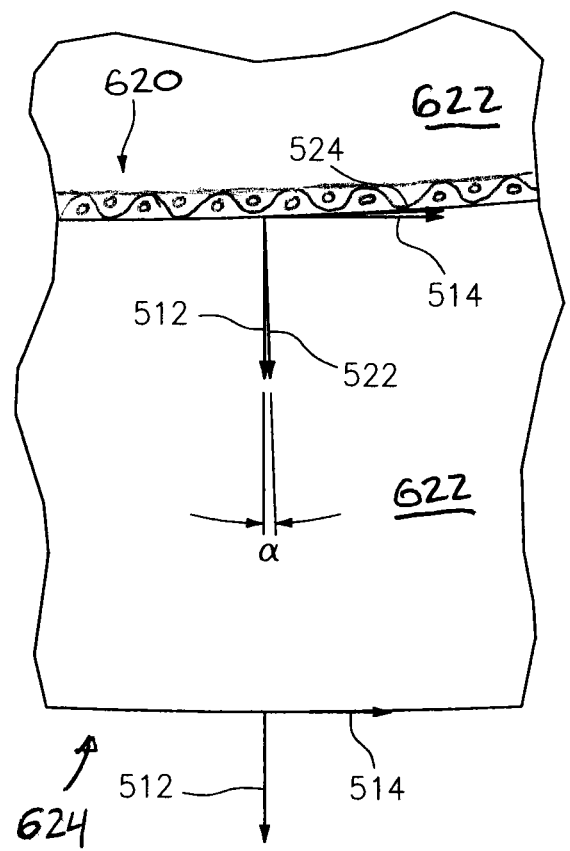
FIG. 12 is a partial end view of a spiral rolled cloth and wax sandwich.

Another approach for casting a spiral is to make a sandwich of woven ceramic or graphite fiber sheet 620 (FIG. 12) with soft wax 622 and roll that to form a tightly wound spiral cylinder 624. Then a shell mold may be formed (e.g., via conventional ceramic stucco shelling) around this spiral cylinder, eventually losing the wax, leaving behind a spiral core formed by woven ceramic fiber/cloth or graphite. A variety of methods may be used to stiffen the woven ceramic cloth, such as embedding ceramic rods along the axis of the roll.

Figure 13:
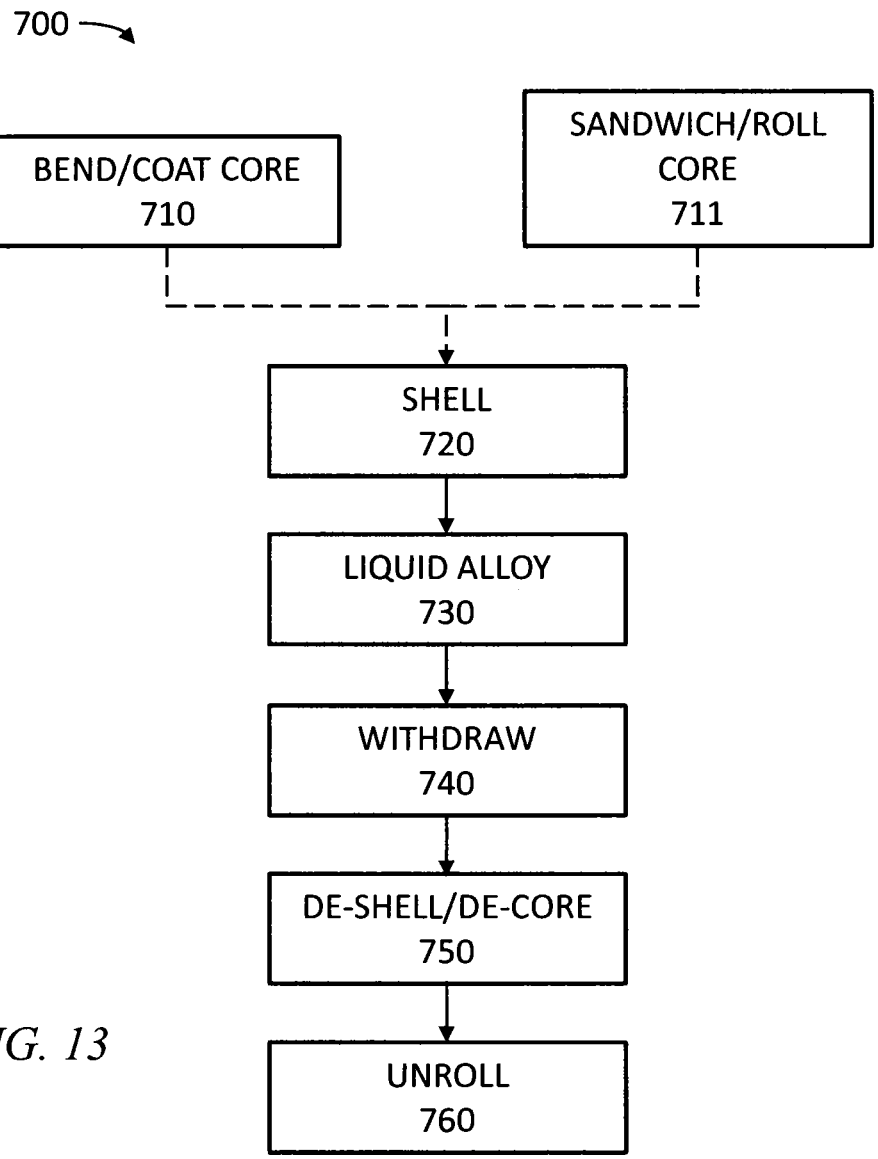
FIG. 13 is a casting flowchart.

FIG. 13 shows a simplified casting process 700 including forming 710/711 a core such as the bending and ceramic coating of the spiral refractory metal core 600 or rolling sandwich 624. The core is shelled 720 and liquid alloy is introduced 730 to the shell. The shell is withdrawn 740 in a direction within 1° of parallel to an axis of the spiral. The shell and core are removed 750 and the spiral unrolled 760.

The use of "first", "second", and the like in the following claims is for differentiation within the claim only and does not necessarily indicate relative or absolute importance or temporal order. Similarly, the identification in a claim of one element as "first" (or the like) does not preclude such "first" element from identifying an element that is referred to as "second" (or the like) in another claim or in the description.

Where a measure is given in English units followed by a parenthetical containing SI or other units, the parenthetical's units are a conversion and should not imply a degree of precision not found in the English units.

One or more embodiments have been described. Nevertheless, it will be understood that various modifications may be made. For example, when applied to an existing baseline configuration, details of such baseline may influence details of particular implementations. Accordingly, other embodiments are within the scope of the following claims.

What is claimed is:

1. A method comprising:
   casting a metallic workpiece having a spiral gap wherein the spiral gap is formed in the casting step; and
   at least partially flattening the workpiece by unrolling.

2. The method of claim 1 wherein:
   the metallic workpiece has a single crystal (SX) structure.

3. The method of claim 1 wherein:
   the metallic workpiece has a modified single crystal (SX) structure characterized by a progressively circumferentially varying crystallographic orientation.

4. The method of claim 1 wherein:
   the spiral of the spiral gap is about an axis within 5° of a <001> or <111> direction of the workpiece.

5. The method of claim 1 wherein:
   the metallic workpiece is a right circular cylinder with said spiral gap.

6. The method of claim 1 wherein:
   the metallic workpiece is a hollow right circular cylinder with said spiral gap.

7. The method of claim 1 wherein:
   the workpiece is a nickel-based superalloy.

8. The method of claim 1 further comprising:
   securing ends of the workpiece to each other or to ends of other similar workpieces so as to form a full hoop.

9. The method of claim 8 wherein:
   the securing comprises welding.

10. The method of claim 1 wherein the casting comprises withdrawing from a furnace in a direction within 1° of parallel to an axis of the spiral of the spiral gap.

11. The method of claim 1 wherein the casting comprises forming a mold by shelling a spiral core.

12. The method of claim 11 further comprising forming the spiral core by bending a refractory metal sheet and ceramic coating the sheet.

13. The method of claim 11 further comprising forming the spiral core by rolling into a spiral a sandwich of a cloth sheet and wax.

* * * * *